United States Patent
Hatano et al.

(10) Patent No.: US 7,879,399 B2
(45) Date of Patent: *Feb. 1, 2011

(54) CV METHOD USING METAL CARBONYL GAS

(75) Inventors: Tatsuo Hatano, Nirasaki (JP); Hideaki Yamasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/193,370

(22) Filed: Aug. 18, 2008

(65) Prior Publication Data

US 2008/0311297 A1 Dec. 18, 2008

Related U.S. Application Data

(63) Continuation of application No. 11/119,906, filed on May 3, 2005, now Pat. No. 7,427,426, which is a continuation-in-part of application No. PCT/JP03/14152, filed on Nov. 6, 2003.

(30) Foreign Application Priority Data

Nov. 6, 2002 (JP) ............................. 2002-322924

(51) Int. Cl.
*C23C 16/16* (2006.01)
(52) U.S. Cl. .................. 427/250; 427/255.23; 427/294; 427/383.1
(58) Field of Classification Search .................. 427/250, 427/255.23, 383.1, 294

See application file for complete search history.

(56) References Cited

U.S. PATENT DOCUMENTS 3,762,938 A 10/1973 Ridenour et al.
4,250,210 A 2/1981 Crosby et al.

(Continued)

FOREIGN PATENT DOCUMENTS

JP 36-20703 10/1961

(Continued)

OTHER PUBLICATIONS

Kohler, Steven D., et al. "Infrared Spectroscopic Characterization of Tungsten Carbonyl Species Formed by Ultraviolet Photoreduction of Silica-Supported W9VI) in Carbon Monoxide" J. Phys. Chem. 1994, 98, pp. 1276-1281.*

(Continued)

*Primary Examiner*—Bret Chen
(74) *Attorney, Agent, or Firm*—Oblon, Spivak, McClelland, Maier & Neustadt, L.L.P.

(57) ABSTRACT

A CVD method for forming a metal film on a substrate by using a metal carbonyl gas includes a preparing step for setting a vacuum chamber at a vacuum pressure and heating the substrate in the vacuum chamber to a first temperature where the metal carbonyl gas is decomposed. Also included are a supplying step for supplying the metal carbonyl gas into the vacuum chamber while exhausting the vacuum chamber with a first vacuum pumping speed and a removing step for removing a decomposed gas of the metal carbonyl gas by stopping supplying of the metal carbonyl gas and quickly exhausting the vacuum chamber with a second vacuum pumping speed sufficiently higher than the first vacuum pumping speed. The supplying step and the removing step can be repeatedly as desired.

15 Claims, 5 Drawing Sheets

U.S. PATENT DOCUMENTS

| | | | |
|---|---|---|---|
| 4,265,982 A | 5/1981 | McCreary et al. | |
| 4,619,840 A * | 10/1986 | Goldman et al. | 438/681 |
| 4,726,961 A * | 2/1988 | Diem et al. | 438/681 |
| 4,857,097 A * | 8/1989 | Berry | 65/60.52 |
| 4,929,468 A | 5/1990 | Mullendore | |
| 4,938,999 A | 7/1990 | Jenkin | |
| 5,008,160 A * | 4/1991 | Jenkin | 428/656 |
| 5,171,610 A * | 12/1992 | Liu | 427/586 |
| 5,372,849 A * | 12/1994 | McCormick et al. | 427/253 |
| 5,855,675 A | 1/1999 | Doering et al. | |
| 6,017,144 A * | 1/2000 | Guo et al. | 700/121 |
| 6,494,959 B1 | 12/2002 | Samoilov et al. | |
| 6,610,361 B1 * | 8/2003 | Heuer et al. | 427/255.18 |
| 6,884,466 B2 | 4/2005 | Kaloyeros et al. | |
| 6,924,223 B2 | 8/2005 | Yamasaki et al. | |
| 6,989,321 B2 | 1/2006 | Yamasaki et al. | |
| 7,063,871 B2 * | 6/2006 | Yamasaki et al. | 427/250 |
| 7,078,341 B2 | 7/2006 | Yamasaki et al. | |
| 7,132,128 B2 | 11/2006 | Brcka | |
| 7,270,848 B2 | 9/2007 | Suzuki et al. | |
| 7,427,426 B2 * | 9/2008 | Hatano et al. | 427/250 |
| 7,459,395 B2 * | 12/2008 | Suzuki | 438/681 |
| 7,488,512 B2 * | 2/2009 | Suzuki et al. | 427/190 |
| 2003/0161952 A1 * | 8/2003 | Wang et al. | 427/255.392 |
| 2003/0198587 A1 * | 10/2003 | Kaloyeros et al. | 423/409 |
| 2003/0203616 A1 * | 10/2003 | Chung et al. | 438/627 |
| 2004/0082169 A1 * | 4/2004 | Chooi et al. | 438/687 |
| 2005/0069641 A1 * | 3/2005 | Matsuda et al. | 427/226 |
| 2006/0219177 A1 * | 10/2006 | Brcka | 118/726 |
| 2008/0289447 A1 * | 11/2008 | Coley et al. | 75/362 |

FOREIGN PATENT DOCUMENTS

JP     3-31475     2/1991

OTHER PUBLICATIONS

Dezelah, Charles, et al., "A low violent metalorganic precursor for the growth of tungsten nitride thin films by atomic layer deposition". J. Mater. Chem., 2007, 17, pp. 1109-1116.*

* cited by examiner

CV METHOD USING METAL CARBONYL GAS

CROSS-REFERENCE TO RELATED APPLICATIONS

This application is a continuation of and claims the benefit of priority under 35 U.S.C. §120 from U.S. application Ser. No. 11/119,906, filed May 3, 2005 which is a Continuation-In-Part Application of PCT International Application No. PCT/JP03/014152 filed on Nov. 6, 2003, claims the benefit of priority under 35 U.S.C. §119 from Japanese patent Application No. 2002-322924, filed Nov. 6, 2002. the entire contents of which are incorporated herein by reference.

FIELD OF THE INVENTION

The present invention relates to a method for forming a film of a metal, e.g., a tungsten (W) or the like, on a substrate to be processed by using a metal carbonyl gas, and a computer readable storage medium storing therein a program for controlling same; more particularly, to a CVD method for use in a semiconductor processing for manufacturing a semiconductor device and a computer readable storage medium storing therein a program for controlling same. The term "semiconductor processing" used herein implies various processes to manufacture semiconductor devices and/or a structure including wiring, electrodes, and the like connected to the semiconductor devices on a substrate to be processed, by forming a semiconductor layer, an insulating layer, a conductor layer, and the like, in a predetermined pattern, on the substrate to be processed, e.g., a semiconductor wafer or a glass substrate for an LCD (Liquid Crystal Display) or an FPD (Flat Panel Display).

BACKGROUND OF THE INVENTION

In a semiconductor device, a tungsten (W) is used as a wiring material of a wiring configuration or a material of an interdiffusion barrier. In this case, a W film is formed to fill in a contact hole or a via hole formed in an interlayer insulating film on a semiconductor wafer, which is a substrate to be processed, or to coat an inner surface thereof.

So far, PVD (Physical Vapor Deposition), typically a sputtering, has been used as a method for forming the W film. However, with PVD, it is difficult to handle a high coverage required under a recent trend toward a miniaturation in a device. For this reason, recently, CVD capable of dealing with such a trend has been employed as a method for forming the W film.

For example, as a processing gas for forming the W film in CVD, a tungsten hexafluoride ($WF_6$) and a reducing gas, an $H_2$ gas are used. In this case, the processing gases react like the following reaction equation, to thereby form the W film on the wafer.

[Reaction Equation]

$$WF_6+3H_2 \rightarrow W+6HF$$

However, since a design rule is getting more and more strict, F has a bad influence on a film quality of a gate oxide film in case of using such an F containing gas, resulting in a device trouble.

Meanwhile, references 1, 2, and 3 disclose that a tungsten carbonyl ($W(CO)_6$) of an organic compound gas is used as a processing gas not containing F, in order to form the W film by using CVD. Further, reference 5 describes that a metal film is formed by CVD using a metal carbonyl like $W(CO)_6$. Still further, reference 4 discloses that the W film is formed in the semiconductor device by CVD using $W(CO)_6$. The metal carbonyl such as $W(CO)_6$ does not have a bad influence on the device unlike $WF_6$, which cause a bad influence on the device due to F, so that it has bright prospects as a source gas of CVD.

Reference 1: Japanese Patent Laid-Open Publication No. Hei 2-225670

Reference 2: Japanese Patent Laid-Open Publication No. Hei 4-173976

Reference 3: Japanese Patent Laid-Open Publication No. Hei 4-27136

Reference 4: Japanese Patent Laid-Open Publication No. 2002-124488

Reference 5: J. Vac. Sc1. Technol., 14(2), March/April, 1996, pp. 415-424

However, there is a problem in using the metal carbonyl like $W(CO)_6$. For instance, CO, which is produced by decomposition of the metal carbonyl gas like $W(CO)_6$, has a strong affinity for a metal. Accordingly CO is adsorbed onto a surface of the substrate to be introduced into the metal film as an impurity. As a result, an electrical resistance of the metal film increases (see right column on p. 417 of reference 5). For the same reason, the metal carbonyl like $W(CO)_6$ has not been put to practical use sufficiently, even if it is considered as a promising CVD source gas.

SUMMARY OF THE INVENTION

It is, therefore, an object of the present invention to provide a CVD method using a metal carbonyl gas and a computer readable storage medium storing therein a program for controlling the CVD method, wherein a bad influence by a decomposed gas, e.g., CO or the like, which is produced by a decomposition of the metal carbonyl gas, is prevented and a metal film having a low electrical resistance is formed on a substrate to be processed.

In accordance with the present invention, there are provided a CVD method for forming a metal film on a substrate to be processed by using a metal carbonyl gas and a computer readable storage medium storing therein a program for controlling same, the method including: a preparing step for setting an inner pressure of a vacuum chamber accommodating the substrate therein at a vacuum pressure and, heating the substrate in the vacuum chamber to a first temperature where the metal carbonyl gas is decomposed; a supplying step for supplying the metal carbonyl gas into the vacuum chamber while exhausting an inside of the vacuum chamber with a first vacuum pumping speed, in a state where the substrate is substantially heated to the first temperature; a removing step for removing, after the supplying step, a decomposed gas produced by a decomposition of the metal carbonyl gas, by stopping supplying of the metal carbonyl gas and quickly exhausting the inside of the vacuum chamber with a second vacuum pumping speed sufficiently higher than the first vacuum pumping speed; and a repeating step for carrying out the supplying step and the removing step repeatedly.

In accordance with the present invention, there are provided a CVD method for forming a metal film on a substrate to be processed by using a metal carbonyl gas and a computer readable storage medium storing therein a program for controlling same, the method including: a preparing step for setting an inner pressure of a vacuum chamber accommodating the substrate therein at a vacuum pressure and, heating the substrate inside the vacuum chamber to a first temperature where the metal carbonyl gas is decomposed; a supplying step for supplying the metal carbonyl gas into the vacuum chamber while exhausting the inside of the vacuum chamber with a first vacuum pumping speed, in a state where the substrate is substantially heated to the first temperature; a removing step for removing, after the supplying step, a decomposed gas produced by a decomposition of the metal carbonyl gas, by stopping supplying the metal carbonyl gas and purging the inside of the vacuum chamber by supplying a purge gas thereto while exhausting the inside of the vacuum chamber with a second vacuum pumping speed; and a repeating step for carrying out the supplying step and the removing step repeatedly.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
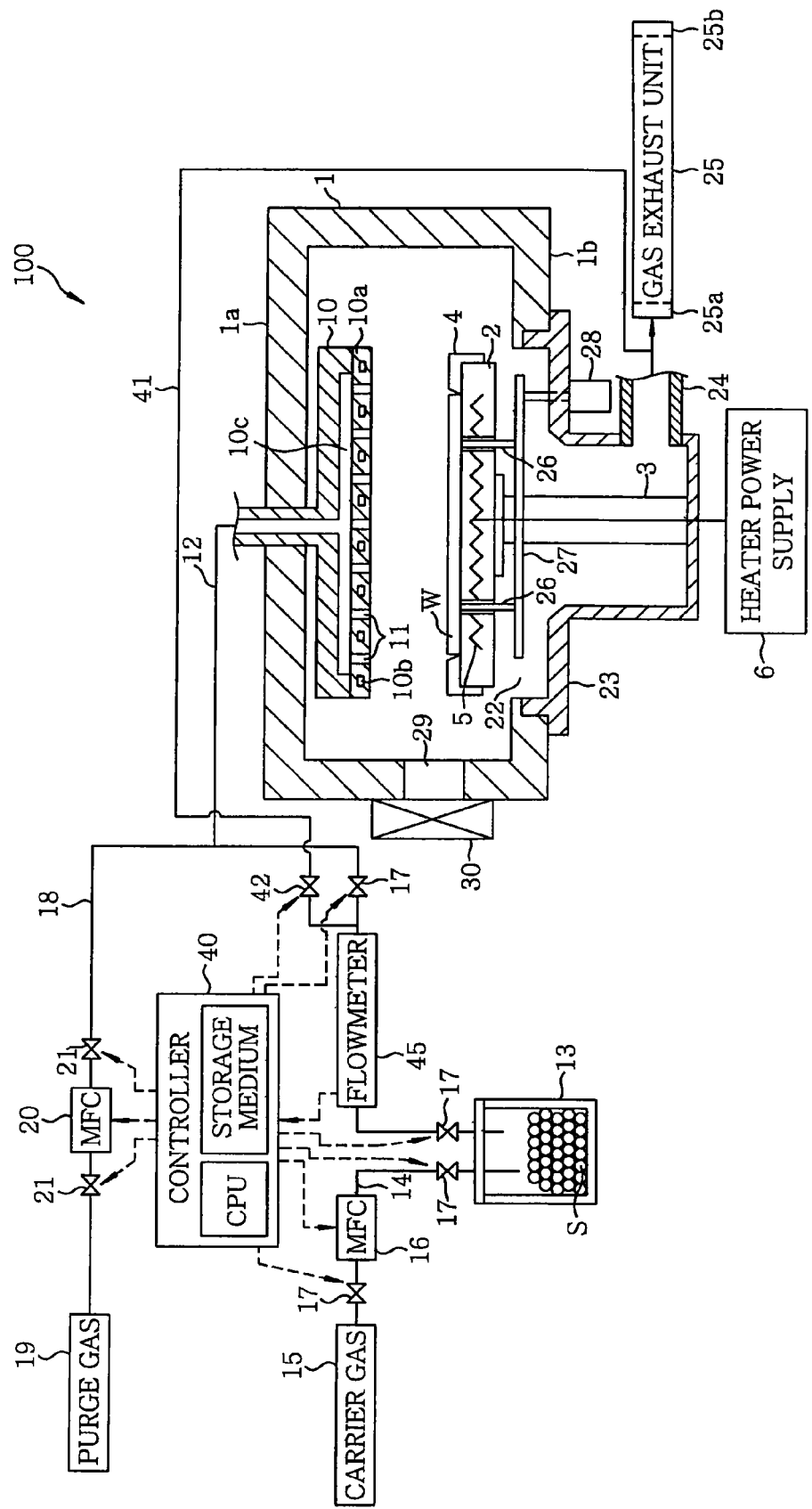
FIG. 1 is a typical view of a CVD apparatus in accordance with a preferred embodiment of the present invention.

Hereinafter, a preferred embodiment of the present invention will be discussed with reference to the drawings. In the following explanation, identical reference numerals will be used for the corresponding parts having substantially same functions and configurations, and redundant expression will be cut to the minimum.

FIG. 1 shows a CVD apparatus schematically in accordance with a preferred embodiment of the present invention. A film forming apparatus 100 includes an airtight, cylindrically shaped vacuum chamber (processing chamber) 1. Inside the processing chamber 1, a susceptor 2 for horizontally supporting a wafer W, a substrate to be processed, is disposed. The susceptor 2 is supported by a cylindrical supporting member 3 installed in a central and lower portion thereof.

On an outer peripheral portion of the susceptor 2, a guide ring 4 for guiding the wafer W is disposed. Alternatively, for example, the susceptor 2 may be configured to have a recess or one or more guide protrusions on the top surface thereof for guiding in place the wafer W without recourse to the separate the guide ring 4. Inside the susceptor 2, a resistance heater 5 is installed. The heater 5 applies heat to the susceptor 2 by receiving a power from a heater power source 6, whereby the wafer W, the substrate to be processed, is heated. And, the $W(CO)_6$ gas is thermally decomposed by this heat. At this time, the susceptor 2 is heated to a predetermined temperature appropriate to a film forming, e.g., 300 to 600° C. A controller (not shown) is connected to the heater power source 6. By the controller, an output of the heater 5 is controlled depending on a signal of a temperature sensor (not shown). Further, inside a wall of the processing chamber 1, a heater (not shown) is installed. The wall of the processing chamber 1 is heated to about 40 to 80° C. by this heater.

A shower head 10 is disposed in a ceiling wall 1a of the processing chamber 1. In a shower plate 10a of a lower part of the shower head 10, a plurality of gas discharge openings 11 for discharging a gas toward the susceptor 2 is formed. One end of a line 12 for supplying a processing gas, e.g., $W(CO)_6$ gas is connected to a top portion of the shower head 10. Inside the shower head 10, a space 10c for diffusing the processing gas is formed. The gas discharge openings 11 penetrate through the space 10c to uniformly supply the processing gas into the processing chamber 1. Further, a concentric circular-shaped coolant path 10b is formed in the shower plate 10a so as to prevent decomposition of $W(CO)_6$ gas in the shower head 10. A coolant, e.g., a cooling water or the like, is supplied into the coolant path 10b from a coolant supply source (not shown), whereby the shower plate 10a is controlled between 20° C. and 100° C.

The other end of the line 12 is inserted into a source container 13 housing a solid $W(CO)_6$ as source S for a film forming process. A carrier gas line 14 is inserted into the container 13 as well. From a carrier gas supply source 15, a carrier gas, e.g., Ar gas, is fed into the source container 13 via a line 14. Then the solid $W(CO)_6$ source S inside the source container 13 is sublimated to a $W(CO)_6$ gas by the supply of the carrier gas. The $W(CO)_6$ gas is carried by the carrier gas, supplied into the shower head 10 via the line 12, diffused in the space 10c, and supplied into the processing chamber 1 through the gas discharge opening 11.

A mass flow controller 16 is installed in the line 14, and valves 17 are disposed at both ends of the mass flow controller 16. Further, in the line 12, there is disposed a flowmeter 45 for measuring a flow rate of the $W(CO)_6$ gas based on, e.g., an amount of $W(CO)_6$ gas between valves 17, which are installed therein. A preflow line 41 is connected to a downstream side of the flowmeter 45 in the line 12. The preflow line 41 is connected to a gas exhaust line 24 that will be mentioned later. In the preflow line 41, a valve 42 is installed in a directly downstream side of a junction portion with a W(CO)6 gas line 12. Around the lines 12, 14, and 41, a heater (not shown) is disposed. The heater is controlled to have a temperature where the $W(CO)_6$ gas is not solidified, e.g., 20 to 100° C., preferably, 25 to 60° C.

Meanwhile, one end of a purge gas line 18 is coupled to the line 12. The other end of the purge gas line 18 is connected to a purge gas supply source 19. The purge gas supply source 19 supplies $H_2$ gas and an inert gas such as Ar gas, He gas, $N_2$ gas, or the like, as a purge gas. Further, a mass flow controller 20 is installed in the purge gas line 18, and valves 21 are disposed at both ends of the mass flow controller 20.

The mass flow controllers 16 and 20, and the valves 17, 21, and 42 are controlled by a controller 40. Accordingly, the supply and stop of the carrier gas, the $W(CO)_6$ gas and the purge gas, and flow rates thereof are controlled. The flowmeter 45 for measuring the flow rate of the $W(CO)_6$ gas is connected to the controller 40, as well. The controller 40 controls the mass flow controller 16 of the carrier gas, based on the value of the flowmeter 45 such that a desired flow rate of the $W(CO)_6$ gas is obtained.

In a central part of a bottom wall 1b of the processing chamber 1, a circular opening 22 is formed. An exhaust chamber 23 penetrating through the opening 22 and protruding downward is disposed in the bottom portion 1b. A gas exhaust line 24 is connected to a side of the gas exhaust chamber 23. A gas exhaust unit 25 having a valve 25a for adjusting an inner pressure of the processing chamber 1 and a vacuum pumping speed, and a high speed vacuum pump 25b is connected to the gas exhaust line 24. By operating the gas exhaust unit 25, inside of the processing chamber 1 can be depressurized up to a predetermined vacuum level at a high speed.

Three supporting pins 26 (only two pins are shown in the drawing) for supporting and elevating the wafer W are provided in the susceptor 2. The supporting pins 26 are disposed to protrude and be depressed for a surface of the susceptor 2. Lower portions of the supporting pins 26 are fixed to a supporting plate 27. The supporting pins 26 are elevated by a driving mechanism 28, e.g., an air cylinder or the like, via the supporting plate 27.

In a sidewall of the processing chamber 1, a loading/unloading port 29 for performing a loading and unloading of the wafer W between the processing chamber 1 and a transfer chamber (not shown) adjacent to the film forming apparatus 100 is installed. The loading/unloading port 29 opens and shuts by a gate valve 30.

Figure 2:
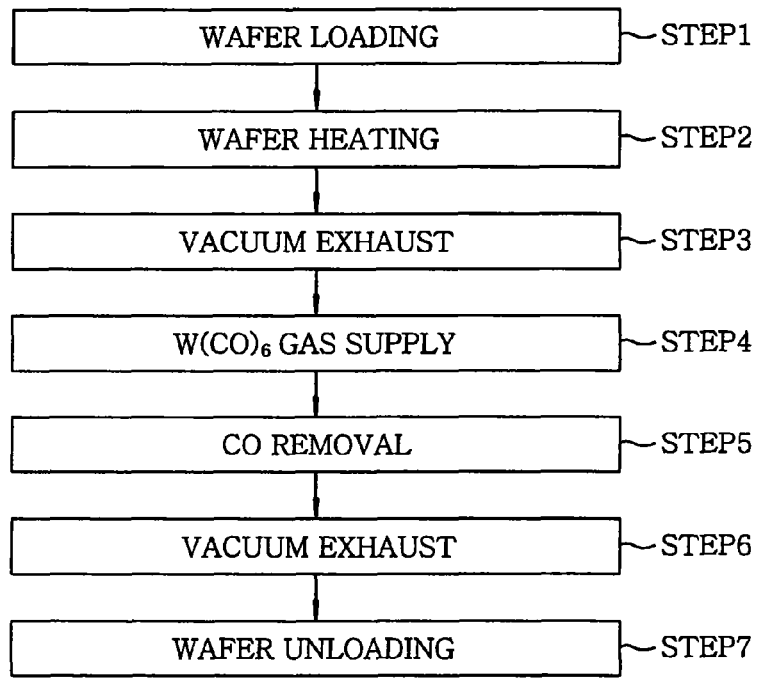
FIG. 2 offers a flowchart for showing a CVD method in accordance with a preferred embodiment of the present invention.

FIG. 2 is a flowchart for showing a CVD method in accordance with a preferred embodiment of the present invention, wherein the W film is formed by using such a film forming apparatus. First, the gate valve 30 is opened to load the wafer W into the processing chamber 1 from the loading/unloading port 29 and the wafer W is mounted on the susceptor 2 (step S1). Subsequently, the susceptor is heated by the heater 5, whereby the wafer W is heated to 300 to 600° C. (step S2). Further, inside of the processing chamber 1 is vacuum exhausted by the gas exhaust unit 25 to order an inner pressure of the processing chamber 1 to a predetermined pressure, e.g., less than 6.7 Pa (step S3). And then, the W film is deposited on a surface of the wafer W. The deposition of the W film is carried out through a $W(CO)_6$ supplying step (step S4) and a CO removing step (step S5).

In the $W(CO)_6$ supplying step (step S4), the carrier gas, e.g., Ar gas, is blown into the source container 13 to thereby sublimate the $W(CO)_6$ source S stored therein. The resultant $W(CO)_6$ gas is carried by the carrier gas and introduced into the processing chamber 1 through the line 12 and the shower head 10. During step S4, the gas exhaust unit 25 is operated at a first exhaust rate (first vacuum pumping speed) to exhaust the inside of the processing chamber 1. At this time, by operating the vacuum pump 25b at the same output rate as in step S3 and adjusting the valve 25a, the first vacuum pumping speed required is obtained.

After supplying the $W(CO)_6$ gas on the surface of the wafer W for a predetermined time, the CO removing step (step S5) is carried out. In the CO removing step (step S5), the supply of the $W(CO)_6$ gas is stopped (i.e., the supply of the carrier gas is stopped) and, at the same time, the gas exhaust unit 25 is operated at a second exhaust rate (second vacuum pumping speed), which is sufficiently higher than the first exhaust rate, to thereby quickly exhaust the inside of the processing chamber 1. At this time, by operating the vacuum pump 25b at the same output rate as in step S4 and adjusting the valve 25a, the second vacuum pumping speed required is obtained. As a result, the CO gas produced by decomposition of the $W(CO)_6$ gas is removed from the processing chamber 1. It is preferable that the second vacuum pumping speed is 3 to 700 times, more preferably, 3 to 100 times, as much as the first vacuum pumping speed. However, a pump with power of more than 700 times the level of the first vacuum pumping speed is too expensive to be preferable. It is preferable that the vacuum pumping speed of the exhaust pump is less than 10,000 L/sec.

The $W(CO)_6$ supplying step (step S4) and the CO removing step (step S5) are repeated until a desired thickness of the W film is reached. Generally, these steps are repeated more than 10 times. At this time, the controller 40 controls the supply and stop of the $W(CO)_6$ gas and the flow rate thereof, and adjusts the valve 25a of the gas exhaust unit 25, according to a predetermined program inputted in advance.

Figure 3A:
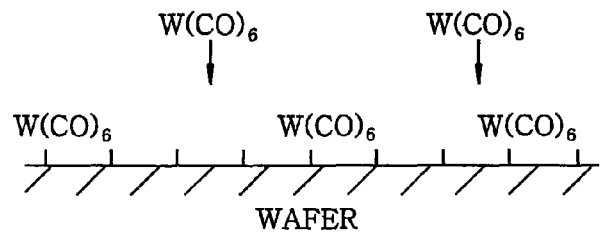
FIGS. 3A and 3B are typical views for explaining a film forming state of a conventional CVD method.
Figure 3B:
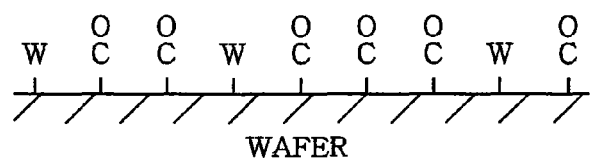

In a prior art, the $W(CO)_6$ gas is continuously supplied into the processing chamber until the W film has a final thickness. In this case, as shown in FIGS. 3A and 3B, the $W(CO)_6$ gas reaches into the surface of the wafer W, first (FIG. 3A). In the surface of the wafer W, $W(CO)_6$ gas is decomposed and the resultant CO is adsorbed in a very short time to a site where W must be adsorbed (FIG. 3B). As a result, CO is introduced into the W film and an electrical resistance increases, resulting in deterioration of the film quality.

Figure 4A:
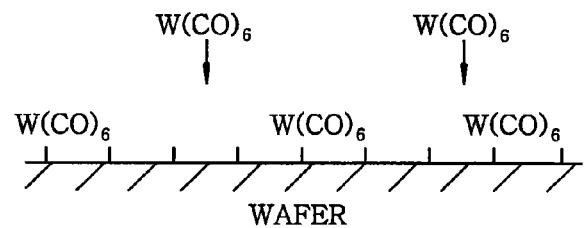
FIGS. 4A through 4D set forth typical views for explaining a film forming state in accordance with a preferred embodiment of the present invention.
Figure 4B:
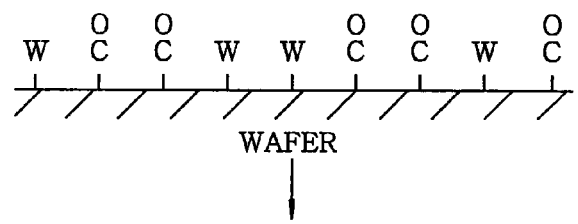
Figure 4C:
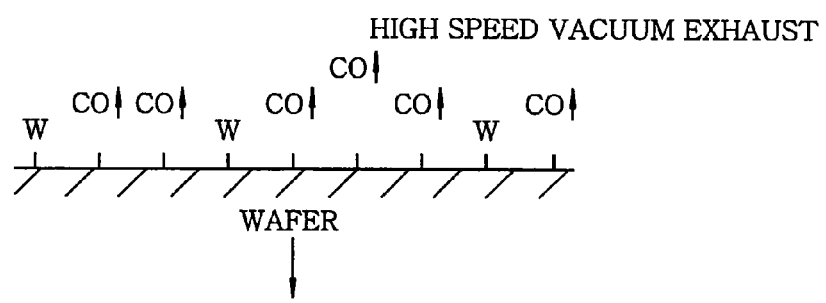
Figure 4D:
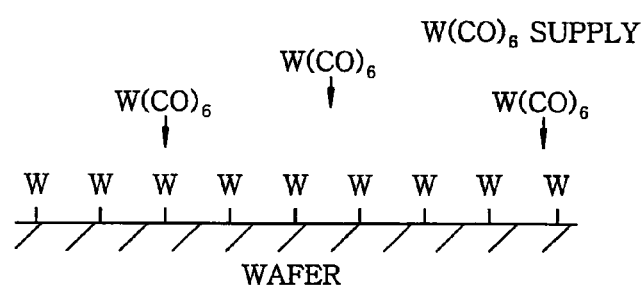

In contrast, in the preferred embodiment of the present invention, the supply of the $W(CO)_6$ gas on the wafer W and the removal of the CO gas by a high speed vacuum pumping are alternately carried out. Here, the CO gas is produced by a decomposition of the $W(CO)_6$ gas. In this case, as shown in FIGS. 4A and 4B, the $W(CO)_6$ gas reaches into the surface of the wafer W in step 4 and the decomposed CO is adsorbed, in a very short time, to the site where W is supposed to be adsorbed. However, as shown in FIG. 4C, CO is removed quickly by a high speed vacuum pumping, in step S5. Then, as shown in FIG. 4D, when next $W(CO)_6$ gas is supplied, the $W(CO)_6$ is adsorbed to the site where CO is removed. As the W film having a predetermined film thickness is formed by performing such steps repeatedly, deterioration of the film quality due to the introduction of CO can be prevented.

In step S4, it is preferred that an inner pressure of the processing chamber 1 is in the range from 0.10 Pa to 666.7 Pa. If the inner pressure goes over 666.7 Pa, there is a concern for deterioration of the W film quality. On the other hand, if the inner pressure is less than 0.10 Pa, a deposition rate becomes too lowered. Further, it is preferable that a residence time of the $W(CO)_6$ gas is 100 sec or less. The flow rate of the $W(CO)_6$ gas is preferably in the range from about 0.01 to 5 L/min.

When removing the CO gas, it can be configured such that a purge gas is introduced from the purge gas supply source 19 while exhausting the processing chamber 1, instead of carrying out such a high speed vacuum pumping mentioned above. In this case, required steps can be carried out by only replacing the gas while maintaining the vacuum pumping speed of the gas exhaust unit 25 substantially same, in the $W(CO)_6$ supplying step (step S4) and the CO removing step (step S5). Further, the purge gas may be the same kind of gas as the carrier gas which was supplied into the processing chamber 1 with $W(CO)_6$ gas in the supplying step (step S4).

When introducing the purge gas, it is preferable that the inside of the processing chamber 1 is exhausted such that the inner pressure of the processing chamber 1 is the same as that when introducing the film forming gas. Therefore, for example, total amounts of gas supply and gas exhaust per unit time may be the same in both steps, i.e., the supplying step (step S4) and the removing step (step S5). However, in order to efficiently carry out the CO gas removal, the vacuum pumping speed of the gas exhaust unit 25 may be improved by making the valve 25a fully opened state (a state where the vacuum pump 25b is operated at a constant output). By introducing the purge gas described above, the adsorbed CO can be forced out more quickly.

Further, in the CO removing step (step S5), as mentioned above, it can be configured such that the purge gas is introduced while carrying out a high speed vacuum pumping, after performing a high speed vacuum pumping for a constant time. In this case, it is preferable that the inner pressure of the processing chamber 1 on purging is substantially same as that in the supplying step (step S4).

The W(CO)$_6$ tends to be easily adsorbed in a relatively low temperature, and CO tends to be easily removed in a relatively high temperature. Therefore, it is preferable that a temperature of the wafer W is kept relatively low when supplying the W(CO)$_6$ gas and relatively high when removing CO. For example, the temperature of the wafer W may be between about 100° C. and 400° C. in case when supplying the W(CO)$_6$ gas, and may be between about 300° C. and 600° C. when removing CO. By doing this, an excellent film forming processing can be performed. In this case, the temperature of the wafer needs to be changed in a short time. Therefore, it is preferable that AlN having a high heat conductivity is used as the susceptor 2 and the susceptor 2 is made as thin as possible. Further, in case of using a lamp heating type heating source instead of a resistance heating type heater 5 as a heating source, it is possible to change the temperature of the wafer in a very short time.

In the W(CO)$_6$ supplying step (step S4), it is preferred that an amount of single supply of W(CO)$_6$ gas is enough for resulting W film of thickness of 2 nm or less. If the film is formed with such a thickness of one time, only a small amount of the CO produced is introduced. More preferably, the amount of single supply of W(CO)$_6$ gas is enough for the W film of thickness of 1.1 nm or less.

It is preferred that a time reserved for the CO removing step (step S5) is in the range from 2 seconds to 60 seconds per one step. If the time reserved for CO removing step is 2 seconds or greater, CO on the wafer W can be removed efficiently. More preferably, if the time reserved for CO removing step is 3 seconds or greater, almost all CO on the wafer W can be removed. On the other hand, if the time reserved for CO removing step is over 60 seconds, a processing efficiency may decline.

In the CO removing step (step S5), it is preferred that a CO exhaust amount per one step is in the range from 30 L to 300 L. More preferably, the CO exhaust amount per one step is more than 40 L, or more than 45 L. If a CO exhaust amount per one step is 30 L or less, CO cannot be removed effectively. If a CO exhaust amount per one step is 300 L or more, there is a problem that a gas exhaust unit having a high vacuum pumping speed (expensive) must be used, or it takes long time to exhaust.

The carrier gas is not limited to Ar gas, but it may be another inert gas. But, it is preferable that the carrier gas may suppress the temperature of the processing gas low. N$_2$ gas, H$_2$ gas and He gas may serve as examples for such function.

Referring to FIG. 2, after completing the W film forming, the inside of the processing chamber 1 is vacuum exhausted to discharge a remaining gas therein (step S6). At this time, the purge gas may flow from the purge gas supply source 19 as a post flow. And, the gate valve 30 is opened to unload the wafer W from the loading/unloading port 29 (step S7).

Figure 5:
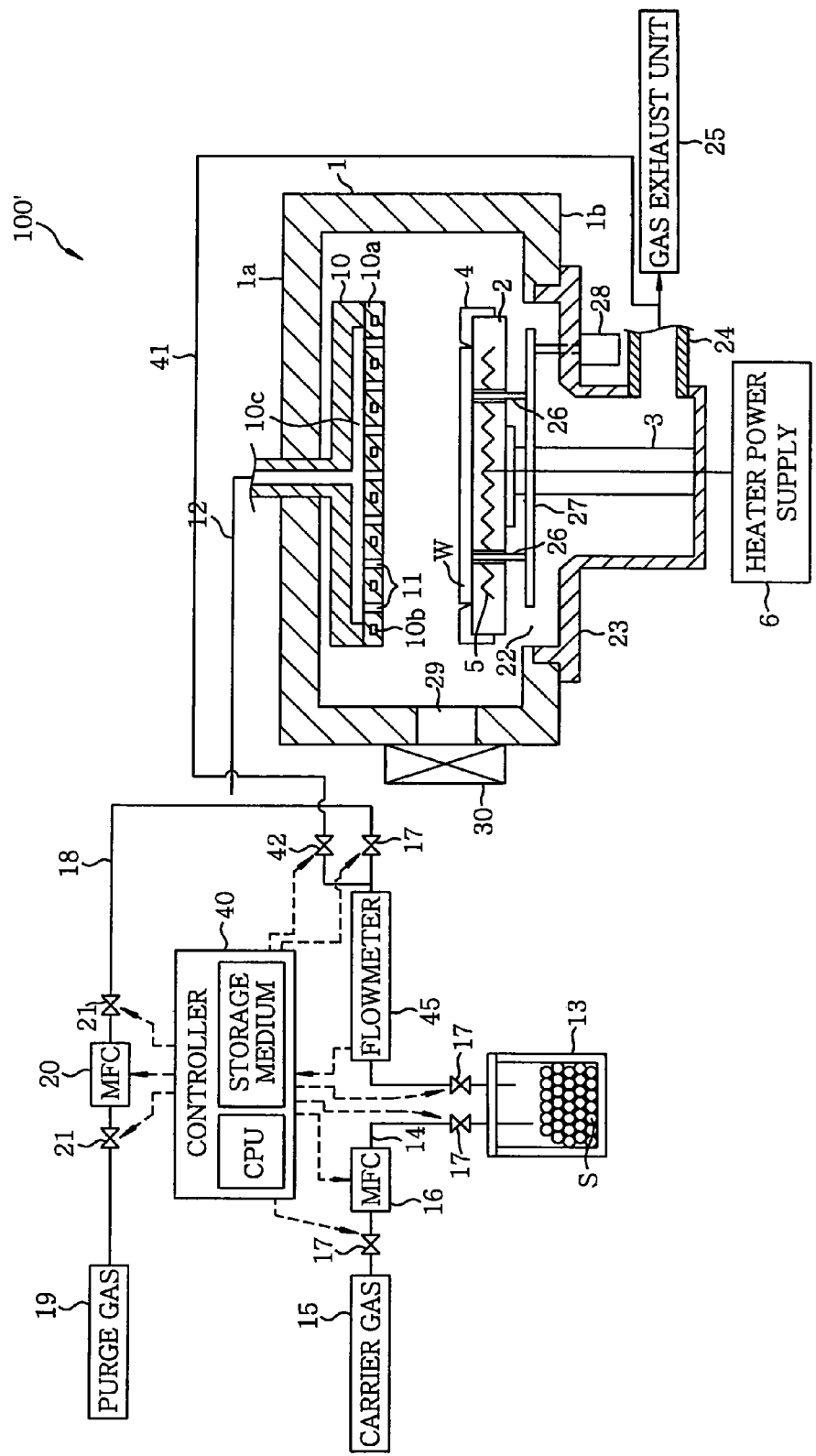
FIG. 5 presents a typical view of a CVD apparatus in accordance with another preferred embodiment of the present invention.

FIG. 5 is a typical view for showing a CVD apparatus in accordance with another preferred embodiment of the present invention. A basic configuration of a film forming apparatus 100' is the same as FIG. 1, except that the apparatus 100' can supply a reducing gas. Namely, one end of a reducing gas line 31 is connected to the line 12, and the other end is connected to a reducing gas supply source 32. The reducing gas supply source 32 supplies a reducing gas, e.g., H$_2$ gas, SiH$_4$ gas, or the like.

A mass flow controller 33 is installed in the reducing gas line 31, and valves 34 are disposed at both ends of the mass flow controller 33. Further, a pre flow line 43 is connected to a downstream side of the mass flow controller 33. The preflow line 43 is connected to the preflow line 41. In the preflow line 43, a valve 44 is disposed in a directly downstream of a junction portion with the reducing gas line 31. The controller 40 controls the mass flow controller 33, and valves 34 and 44 to control the supply and stop of the reducing gas and the flow rate thereof.

When forming the W film by using the film forming apparatus shown in FIG. 5, the reducing gas is supplied from the reducing gas supply source 32 in the CO removing step (step S5) shown in FIG. 2. As a result, decomposition of the adsorbed W(CO)$_6$ and the CO removal are facilitated, so that the deposition rate can be further increased.

In the apparatus 100 and 100' shown in FIGS. 1 and 5, it may be preferable that the controller 40 is configured to control operations of additional electrical and mechanical components, e.g., the driving mechanism 28, the heater power supply 6, and the gas exhaust unit 25. The controller 40 can be implemented by a general purpose computer, e.g., PC (personal computer), which has, e.g., a CPU, a mother board (MB), a hard disk (HD), memories such as ROM and RAM, a CD/DVD drive and so on. In such a case, the process control can be carried out in a completely automated manner under the control of a control program or a software running on the controller 40. Though not specifically depicted in FIGS. 1 and 5, control signals are provided from the controller 40 to the aforementioned additional electrical and mechanical components via controller lines (not shown). The control program can be directly programmed on the controller 40 or can be programmed outside and provided thereto via, e.g., a network or the CD/DVD drive and then stored in, e.g., the hard disk for the execution thereof.

Meanwhile, experiments for forming the W film were conducted under various conditions, by using the apparatus of FIG. 1. At this time, an inner pressure of the processing chamber 1 and the temperature of the wafer were set to 66.7 Pa and 440° C., respectively. In addition, W films each having a thickness of about 30 nm was formed under the following six conditions.

[Condition 1]

A W film of 35 nm was formed by continuously supplying the W(CO)$_6$ gas with a gas flow rate of 0.5 L/min.

[Condition 2]

The W(CO)$_6$ gas was supplied for 1.5 seconds with a gas flow rate of 0.5 L/min (corresponding to the W film having a thickness of 0.16 nm). Subsequently, the supply of the W(CO)$_6$ gas was stopped and a high speed vacuum pumping was carried out for 5 seconds with an exhaust rate of 150 L/sec. By repeating such supplying and purging steps 190 times, a W film of 30 nm was formed.

[Condition 3]

The W(CO)$_6$ gas was supplied for 1.5 seconds with a gas flow rate of 0.5 L/min (corresponding to the W film having a thickness of 0.16 nm). Subsequently, the supply of the W(CO)$_6$ gas was stopped and the purge processing was carried out for 3 seconds by using Ar gas with a flow rate of 0.5 L/min (exhaust rate 15.3 L/sec). By repeating such supplying and purging steps 190 times, a W film of 30 nm was formed.

[Condition 4]

The W(CO)$_6$ gas was supplied for 1.5 seconds with a gas flow rate of 0.5 L/min (corresponding to the W film having a thickness of 0.17 nm). Subsequently, the supply of the W(CO)$_6$ gas was stopped and the purge processing was carried out for 5 seconds by using Ar gas with a flow rate of 0.5 L/min (exhaust rate 15.3 L/sec). By repeating such supplying and purging steps 190 times, a W film of 32 nm was formed.

[Condition 5]

The W(CO)$_6$ gas was supplied for 1.5 seconds with a gas flow rate of 0.5 L/min (corresponding to the W film having a thickness of 0.16 nm). Subsequently, the supply of the W(CO)$_6$ gas was stopped and the purge processing was carried out for 10 seconds by using Ar gas with a flow rate of 0.5 L/min (exhaust rate 15.3 L/sec). By repeating such supplying and purging steps 190 times, a W film of 30 nm was formed.

[Condition 6]

The W(CO)$_6$ gas was supplied for 1.5 seconds with a gas flow rate of 0.5 L/min (corresponding to the W film having a thickness of 0.16 nm). Subsequently, the supply of the W(CO)$_6$ gas was stopped, a high speed vacuum pumping was carried out for 5 seconds with an exhaust rate of 150 L/sec and the purge processing was carried out for 5 seconds by using Ar gas with a flow rate of 0.5 L/min (exhaust rate 15.3 L/sec). By repeating such supplying and purging steps 190 times, a W film of 30 nm was formed.

Figure 6:
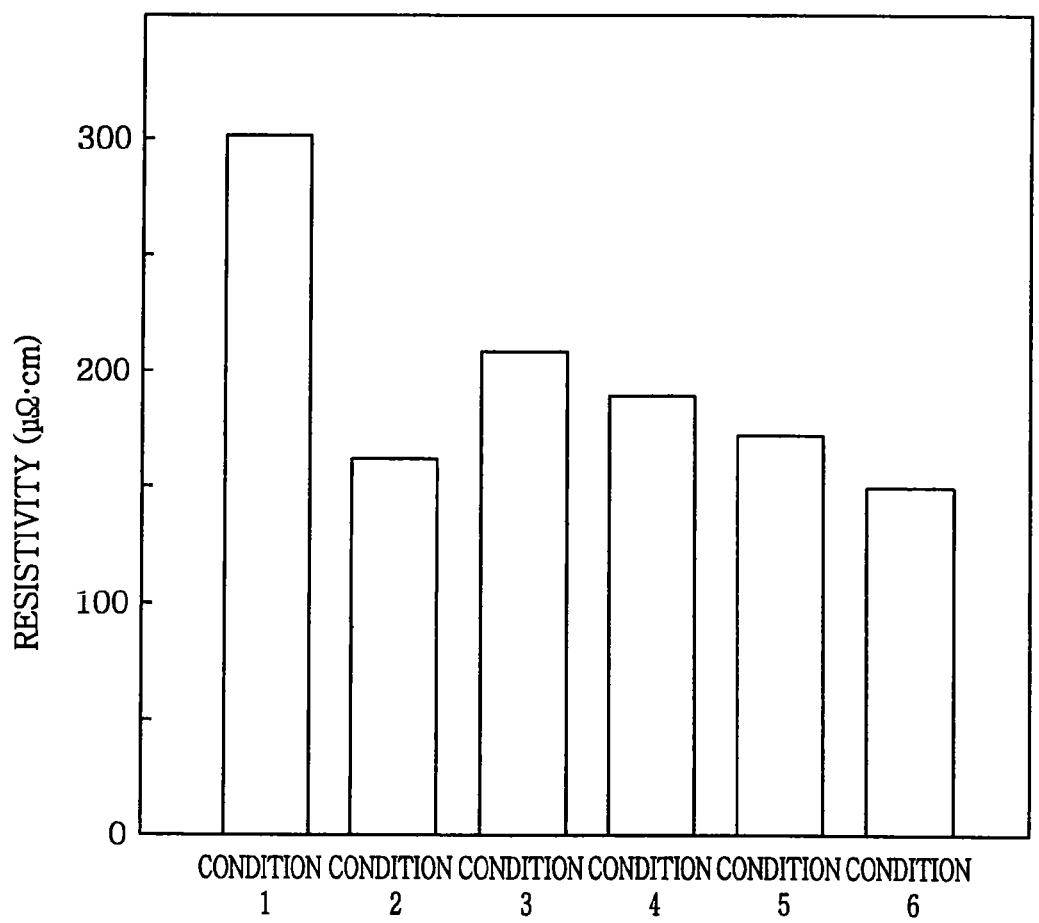
FIG. 6 provides a graph for showing resistivities of W films for different process conditions.

FIG. 6 is a graph for showing resistivities of the W films formed under such conditions. As shown in FIG. 6, in condition 1 where the W film is formed continuously, a resistivity of the W film is 300 μΩcm. Contrary to this, in conditions 2 to 6 according to the preferred embodiment of the present invention, the respective resistivities of the W films are sufficiently low values, compared with that in condition 1. Accordingly, in accordance with the preferred embodiment of the present invention, it is confirmed that a superior film quality having a low resistivity can be obtained.

In conditions 3 to 5, times needed for the CO removal by Ar purge were 3, 5, and 10 seconds, respectively. As shown in FIG. 6, the resistivity of the W film becomes low as the time needed for CO removal increases. Further, the resistivity of the W film in condition 6 where the purging step was carried out after vacuum exhausting was lower than that in condition 5 where only purging step was carried out, even if the time needed for the CO removal was 10 seconds in both conditions.

The aforementioned conditions may be preferably controlled by the controller 40 in a fully automated manner, as described above in connection with the film forming apparatus 100 and 100' shown in FIGS. 1 and 5.

Further, in the aforementioned preferred embodiments, a case where the W film was formed by using the W(CO)$_6$ gas as the metal carbonyl gas was explained, for example. However, the metal carbonyl gas may be at least one kind of gas selected from the group consisting of W(CO)$_6$, Ni(CO)$_4$, Mo(CO)$_6$, Co$_2$(CO)$_8$, Rh$_4$(CO)$_{12}$, Re$_2$(CO)$_{10}$, Cr(CO)$_6$, and Ru$_3$(CO)$_{12}$.

In a case of using a single gas of these gases, a metal film of W, Ni, Mo, Co, Rh, Re, Cr, or Ru may be formed.

Further, in the aforementioned preferred embodiments, the semiconductor wafer was used as the substrate to be processed, for example. However, a glass substrate for LCD or FPD may be used as the substrate to be processed.

In accordance with the present invention, the supply of the metal carbonyl gas to the substrate to be processed and the removal of a decomposed gas, e.g., CO produced by decomposition of the metal carbonyl gas are alternately carried out. Therefore, the decomposed gas, e.g., CO, can be quickly removed even if it is adsorbed to the metal film, and an amount of the decomposed gas, e.g., CO, introduced into the film is reduced. Accordingly, a high quality metal film having a low electrical resistance can be formed.

While the invention has been shown and described with respect to the preferred embodiments, it will be understood by those skilled in the art that various changes and modifications may be made without departing from the spirit and scope of the invention as defined in the following claims.

What is claimed is:

1. A CVD method for forming a metal film on a substrate to be processed by using a metal carbonyl gas, the method comprising:
a preparing step for setting an inner pressure of a vacuum chamber accommodating the substrate therein at a vacuum pressure and, heating the substrate inside the vacuum chamber to a first temperature where the metal carbonyl gas is decomposed;
a supplying step for supplying the metal carbonyl gas composed of a metal carbonyl and a carrier gas into the vacuum chamber while exhausting the inside of the vacuum chamber with a first vacuum pumping speed, in a state where the substrate is substantially heated to the first temperature;
a removing step for removing, after the supplying step, a decomposed gas produced by a decomposition of the metal carbonyl gas, by stopping supplying the metal carbonyl gas and purging the inside of the vacuum chamber by supplying a purge gas thereto while exhausting the inside of the vacuum chamber with a second vacuum pumping speed, wherein in the removing step, the inside of the vacuum chamber is exhausted such that the inner pressure of the vacuum chamber remains identical to the inner pressure of the vacuum chamber in the supplying step; and
a repeating step for carrying out the supplying step and the removing step repeatedly,
wherein the carrier gas and the purge gas are inert gases.

2. The CVD method of claim 1, wherein the first and the second vacuum pumping speed are substantially same.

3. The CVD method of claim 1, wherein the purge gas is the same as the carrier gas.

4. The CVD method of claim 1, wherein in the removing step, the substrate is heated to a second temperature higher than the first temperature.

5. The CVD method of claim 1, wherein the supplying step and the removing step are repeated ten times or more.

6. The CVD method of claim 1, wherein the removing step is carried out for 2 seconds to 60 seconds.

7. The CVD method of claim 6, wherein in the removing step, an amount of gas exhaust is 30 L to 300 L.

8. The CVD method of claim 1, wherein an amount of the metal carbonyl gas supplied in the supplying step corresponds to a thickness of 2 nm or less of the metal film.

9. The CVD method of claim 1, wherein the metal carbonyl gas is at least one species of gas selected from the group consisting of W(CO)$_6$, Ni(CO)$_4$, Mo(CO)$_6$, Co$_2$(CO)$_8$, Rh$_4$(CO)$_{12}$, Re$_2$(CO)$_{10}$, Cr(CO)$_6$, and Ru$_3$(CO)$_{12}$.

10. The CVD method of claim 9, wherein the metal carbonyl gas is W(CO)$_6$, and the first temperature is between 300° C. and 600° C.

11. The CVD method of claim 1, wherein total amounts of gas supply and gas exhaust per unit time while supplying the purge gas into the vacuum chamber are identical to those in the supplying step.

12. A CVD method for forming a metal film on a substrate to be processed by using a metal carbonyl gas, the method comprising:
a preparing step for setting an inner pressure of a vacuum chamber accommodating the substrate therein at a vacuum pressure and, heating the substrate inside the vacuum chamber to a first temperature where the metal carbonyl gas is decomposed;
a supplying step for supplying the metal carbonyl gas into the vacuum chamber while exhausting the inside of the vacuum chamber with a first vacuum pumping speed, in a state where the substrate is substantially heated to the first temperature;

a removing step for removing, after the supplying step, a decomposed gas produced by a decomposition of the metal carbonyl gas, by stopping supplying the metal carbonyl gas and purging the inside of the vacuum chamber by supplying a purge gas thereto while exhausting the inside of the vacuum chamber with a second vacuum pumping speed; and a repeating step for carrying out the supplying step and the removing step repeatedly, wherein in the removing step, the substrate is heated to a second temperature higher than the first temperature.

13. The CVD method of claim 12, wherein in the removing step, a reducing gas is supplied into the vacuum chamber.

14. A CVD method for forming a metal film on a substrate to be processed by using a metal carbonyl gas, the method comprising:

setting an inner pressure of a vacuum chamber accommodating the substrate therein at a vacuum pressure and, heating the substrate inside the vacuum chamber to a first temperature where the metal carbonyl gas is decomposed;

supplying the metal carbonyl gas composed of a metal carbonyl and a carrier gas into the vacuum chamber while exhausting the inside of the vacuum chamber with a first vacuum pumping speed, in a state where the substrate is substantially heated to the first temperature;

removing, after supplying the metal carbonyl gas, a decomposed gas produced by a decomposition of the metal carbonyl gas, by stopping supplying the metal carbonyl gas and purging the inside of the vacuum chamber by supplying a purge gas thereto while exhausting the inside of the vacuum chamber with a second vacuum pumping speed, wherein in the removing step, the inside of the vacuum chamber is exhausted such that the inner pressure of the vacuum chamber remains identical to the inner pressure of the vacuum chamber in the supplying step; and carrying out the supplying step and the removing step repeatedly, wherein the carrier gas and the purge gas are inert gases.

15. The CVD method of claim 14, wherein the first and the second vacuum pumping speed are substantially same.

* * * * *